(12) United States Patent  
Ogura

(10) Patent No.: US 6,597,026 B2  
(45) Date of Patent: Jul. 22, 2003

(54) SEMICONDUCTOR DEVICE COMPRISING PLURAL ISOLATED CHANNELS IN A SHALLOW TRENCH ISOLATION REGION

(75) Inventor: Takashi Ogura, Tokyo (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 09/740,980

(22) Filed: Dec. 21, 2000

(65) Prior Publication Data

US 2001/0005022 A1 Jun. 28, 2001

(30) Foreign Application Priority Data

Dec. 22, 1999 (JP) .......................................... 11-364412

(51) Int. Cl.[7] ........................ H01L 29/80; H01L 31/112
(52) U.S. Cl. ........................ 257/287; 257/374; 257/510
(58) Field of Search ................................ 257/213, 241, 257/287, 288, 337, 368, 374, 390, 510, 324, 401

(56) References Cited

U.S. PATENT DOCUMENTS

| | | | |
|---|---|---|---|
| 5,025,419 A | | 6/1991 | Nishino |
| 5,559,050 A | | 9/1996 | Alsmeier et al. |
| 5,742,090 A | * | 4/1998 | Stolmeijer et al. ........... 257/510 |
| 5,777,370 A | * | 7/1998 | Omid-Zohoor et al. ...... 257/374 |
| 5,789,792 A | * | 8/1998 | Tsutsumi .................... 257/506 |
| 6,111,296 A | | 8/2000 | Yamazaki et al. |
| 6,373,082 B1 | * | 4/2002 | Ohno et al. .................. 257/206 |

FOREIGN PATENT DOCUMENTS

| | | |
|---|---|---|
| JP | 2-34969 | 2/1990 |
| JP | 8-46199 | 2/1996 |
| JP | 10-65162 | 3/1998 |
| JP | 11-340460 | 12/1999 |

OTHER PUBLICATIONS

Ono et al.; "TED Control Technology for Suppression of Reverse Narrow Channel Effect in 0.1 MOS Devices"; Technical Digest of International Electron Devices Meeting; Dec. 1997; pp. 227–230.

Kawaguchi et al.; "A Robust 0.15$\mu$m CMOS Technology with CoSi$_2$ Salicide and Shallow Trench Isolation"; Symposium on VLSI Technology Digest of Technical Papers; Jun. 1997; pp. 125–126.

* cited by examiner

Primary Examiner—Wael Fahmy  
Assistant Examiner—Hoai Pham  
(74) Attorney, Agent, or Firm—Foley & Lardner

(57) ABSTRACT

A semiconductor device includes a plurality of shallow trench isolation bands, a plurality of channels, a source electrode, a drain electrode, and a gate electrode. The shallow trench isolation bands are formed in a band-like shape within an element formation region defined by a shallow trench isolation region. The plurality of channels are isolated from each other by the shallow trench isolation bands and extend parallel to each other. The source electrode is formed at one end of each channel. The drain electrode is formed at the other end of each channel. The gate electrode is formed on the channels across the shallow trench isolation bands. A method of manufacturing this device is also disclosed.

19 Claims, 13 Drawing Sheets

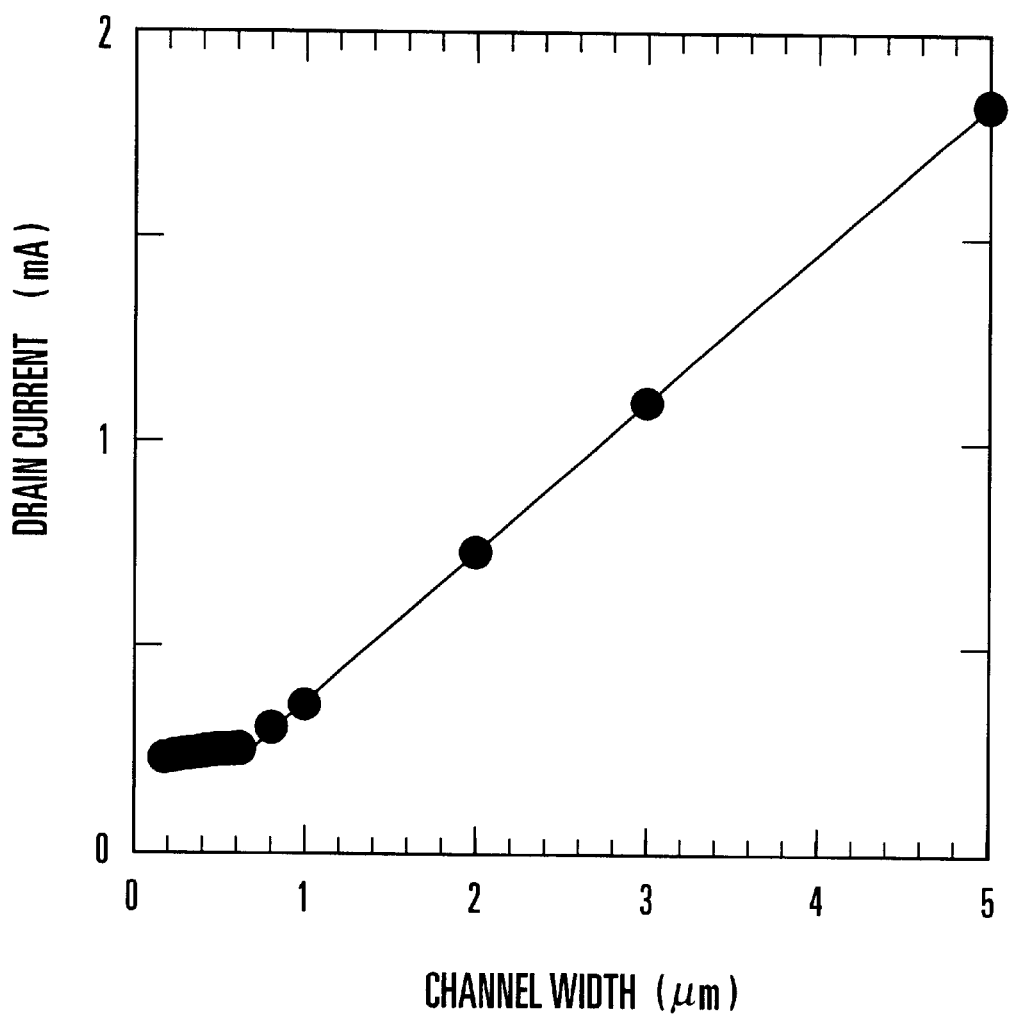
F I G. 12

SEMICONDUCTOR DEVICE COMPRISING PLURAL ISOLATED CHANNELS IN A SHALLOW TRENCH ISOLATION REGION

BACKGROUND OF THE INVENTION

The present invention relates to a semiconductor device with a MISFET (Metal Insulator Semiconductor Field Effect Transistor) isolated by a shallow trench isolation (STI) structure and, more particularly, to a semiconductor device with a wide-channel MISFET having a reverse narrow channel effect substantially the same as that of a narrow-channel MISFET.

As the integration degree of semiconductor devices increases, the isolation portion of a MISFET as the main element constituting the integrated circuit of a semiconductor device must also be micropatterned. To isolate a MISFET, shallow trench isolation is employed in place of an isolation structure, e.g., LOCOS (LOCal Oxidation of Silicon), which is difficult to micropattern. Shallow trench isolation is employed because of two main reasons. The first reason is that when the isolation width becomes almost 0.35 μm or less, in a LOCOS structure, the isolation breakdown voltage decreases rapidly. The second reason is a decrease in element region occurring when an oxide film bites in it, which is called a bird's beak of LOCOS. A scheme that solves these problems to decrease the pitch of elements to be arranged is shallow trench isolation. This is indispensable in high integration of elements.

In a semiconductor device integrated circuit, a plurality of MISFETs with various channel widths different from each other are formed on a single substrate. For example, a narrow-channel MISFET and a wide-channel MISFET are used as elements constituting a static random access memory and a power circuit, respectively, of one semiconductor device, and are mixedly formed on one substrate.

FIGS. 7 and 8 show a conventional semiconductor device with a plurality of MISFETs isolated by shallow trench isolation and having channel widths different from each other.

As shown in FIGS. 7 and 8, a conventional semiconductor device 60 has, on a silicon substrate 62, three narrow-channel MISFETs 66 each with a small channel width W1 and a wide-channel MISFET 68 with a large channel width W2 respectively formed in element formation regions defined by shallow trench isolation regions 64.

The narrow-channel MISFETs 66 and wide-channel MISFET 68 respectively have gate electrodes 72 and 74 through gate insulating films 70. Each narrow-channel MISFET 66 has a source electrode 76 and drain electrode 78 respectively at its two channel ends. The wide-channel MISFET 68 has a source electrode 80 and drain electrode 82 respectively at its two channel ends.

The conventional semiconductor device described above has the following problems. FIG. 10 shows the gate voltage to drain current characteristics of MISFETs with 0.2-, 1-, and 10-μm channel widths which serve as conductor paths. It is apparent from FIG. 10 that the gate voltage to drain current characteristics of the MISFETs with 1- and 10-μm channel widths form nonlinear curves with steps. In other words, hump characteristics appear in these characteristics. The subthreshold regions of MISFETs with the 1- and 10-μm channel widths and exhibiting the hump characteristics have the same characteristics as those of the MISFET with the 0.2-μm channel width where no hump characteristic is observed.

In order to explain these phenomena, the channel of a MISFET will be analyzed by dividing it into a channel side edge portion along the shallow trench isolation region and a channel planar portion between two channel side edge portions when seen in the direction of channel width. Note that the channel side edge portion is rounded with a predetermined radius of curvature during a MISFET manufacturing process.

In a wide-channel MISFET with a shallow trench isolation structure, when a voltage is applied to the gate electrode, a gate electric field generated by the applied voltage is locally concentrated at the channel side edge portion crossing the gate electrode. Even when the same gate voltage is applied, the gate electric field becomes higher at this portion than at the channel planar portion, and the threshold voltage of the channel side edge portion becomes lower than the threshold voltage of the channel planar portion. Therefore, an inversion layer is formed in the channel side edge portion before in the channel planar portion to render an ON state, so a channel drain starts to flow undesirably.

As a result, the channel side edge portion of the MISFET where the threshold voltage is low and the channel planar portion of the MISFET where the threshold voltage is high exist in the form of parallel connection. For this reason, in a wide-channel MISFET, e.g., one with a channel width of 10 μm, a hump characteristic curve indicated by a solid line in FIG. 10 appears where that indicated by a broken line is to be obtained ideally. The hump characteristics are represented by two curve portions sandwiching a characteristic change point.

In a narrow-channel MISFET, e.g., one with a channel width of 0.2 μm, the channel planar portion has a width almost equal to the radius of curvature of the channel side edge portion. Thus, the gate electric field becomes almost equal between the channel side edge portion and the channel planar portion. In this case, the threshold voltage of the channel planar portion becomes equal to that of the drain current flowing through the channel side edge portion, inversion layers are formed in the channel side edge portion and channel planar portion simultaneously, and drain current starts to flow there. Therefore, the hump characteristics are not observed.

Appearance of the hump characteristics described in the above manner means that a subthreshold coefficient degrades in a wide-channel MISFET. In other words, the switching characteristics of the MISFET degrade. Due to the hump characteristics, upon application of a gate voltage equal to or lower than the threshold voltage, even when the gate voltage is kept unchanged, a subthreshold current larger than the ideal subthreshold characteristics by one or more orders of magnitudes flows. Therefore, if the MISFET is OFF, the power consumption increases.

Another problem arises as follows. When the channel width of the MISFET becomes 2 μm or less, the threshold voltage of the MISFET decreases greatly depending on the channel width, that is, a phenomenon called a reverse narrow channel effect occurs.

FIG. 9 shows the channel width dependence of the threshold voltage, i.e., so-called narrow channel characteristics, that occurs when the channels of the MISFETs are doped with an impurity of the same concentration. The reverse narrow channel effect appears in these narrow channel characteristics. As shown in FIG. 9, with the channel width of 2 μm or less, the threshold voltage varies depending on the channel width due to the reverse narrow channel effect. Therefore, in the semiconductor device described above with the wide- and narrow-channel MISFETs on the same substrate, the threshold voltage of the wide-channel MISFET and that of the narrow-channel MISFET differ from each other.

According to "TED Control Technology for Suppression of Reverse Narrow Channel Effect in 0.1 μm MOS Device", Technical Digest of International Electron Device Meeting 1997, pp. 227–230, December 1997 (reference 1), during the manufacturing process for a MISFET with shallow trench isolation, transient enhanced diffusion causes redistribution of the channel impurity in the channel side edge portion. Hence, in a MISFET with a small channel width, the impurity concentration decreases over the entire channel when compared to that in a wide-channel MISFET.

When a MISFET with these characteristics is used in an integrated circuit, the following problems arise. For example, a static RAM with a CMOS cell structure is sometimes designed with a channel width of 0.3 μm or less to achieve a high integration degree. At this time, if the concentration of the channel impurity is set to match the threshold voltage of a wide-channel MISFET existing on the same substrate, sufficient cutoff is disabled because of a decrease in threshold voltage described above.

Consequently, a short circuit current, in other words, a subthreshold current, flows in the CMOS circuit to increase the power consumption, thereby degrading the circuit performance. In an integrated circuit where MISFETs with variously different channel widths are present, the timings of signals generated by respective signal circuits that make up the integrated circuit do not coincide with each other to cause clock skew, thus hindering the circuit operation. In this manner, the reverse narrow channel effect adversely affects the integrated circuit seriously.

When silicon oxide is used to form an insulator that fills an isolation trench to constitute the shallow trench isolation region 64 (FIGS. 7 and 8), the silicon oxide which fills the isolation trench is etched with hydrofluoric acid in a process during the integrated circuit manufacture. Hence, the upper surface of the shallow trench isolation region becomes lower than the intermediate channel portion of the MISFET, thus forming a gate electrode to surround the channel side edge portion. As a result, the electric field formed upon application of the gate voltage to the gate electrode is further enhanced to decrease the threshold voltage more greatly.

"A Robust 0.15 μm CMOS Technology with $CoSi_2$ Salicide and Shallow Trench Isolation", 1997 Symposium on VLSI Technology Digest of Technical Papers, pp. 125–126, June 1997 (reference 2) proposes an attempt to suppress the reverse narrow channel effect phenomenon by ion-implanting an impurity to the trench side wall.

According to inference from reference 2, as shown in FIG. 11A, a silicon oxide film 81 and silicon nitride film 82 are sequentially formed on a silicon substrate 62. The silicon oxide film 81 and silicon nitride film 82 are etched by using a photoresist 83, the element region of which has been patterned by lithography, to form an etching mask for silicon nitride film 82. Subsequently, as shown in FIG. 11B, the silicon substrate 62 is etched to form an isolation trench 84 by using the etching mask of the silicon nitride film 82, and an impurity is introduced to the side wall of the isolation trench 84.

As shown in FIG. 11C, an insulating film 85 is formed on the entire surface of the silicon substrate 62, thereby burying the insulating film 85 in the isolation trench 84. As shown in FIG. 11D, the insulating film 85 is planarized to form a shallow trench isolation region 64. After that, the silicon nitride film 82 is removed, and an impurity for determining the threshold voltage is introduced to the channel portion of the MISFET. Then, as shown in FIG. 11E, a gate insulating film 70 and gate electrode 74 are formed, thereby forming the MISFET.

To suppress the problem caused by the reverse narrow channel effect in accordance with the method described in reference 2, a compensation step such as an ion implantation step of implanting an impurity for adjusting the threshold voltage is required, as shown in FIG. 11B. This complicates the process to lead to an increase in the manufacturing cost.

SUMMARY OF THE INVENTION

It is an object of the present invention to provide a semiconductor device in which the threshold voltage does not vary depending on the size of the channel width.

It is another object of the present invention to provide a semiconductor device with good, linear gate voltage to drain current characteristics.

It is still another object of the present invention to provide a semiconductor device in which the number of steps is decreased to decrease the manufacturing cost.

In order to achieve the above objects, according to the present invention, there is provided a semiconductor device comprising a plurality of shallow trench isolation bands formed in a band-like shape within an element formation region defined by a shallow trench isolation region, a plurality of channels isolated from each other by the shallow trench isolation bands and extending parallel to each other, a common source region/electrode formed at one end of each of the channels, a common drain region/electrode formed at the other end of each of the channels, and a common gate electrode formed on the channels across the shallow trench isolation bands.

BRIEF DESCRIPTION OF THE DRAWINGS

FIG. 12 is a graph showing the channel width dependence of the saturation drain current;

DESCRIPTION OF THE PREFERRED EMBODIMENTS

First Embodiment

Figure 1:
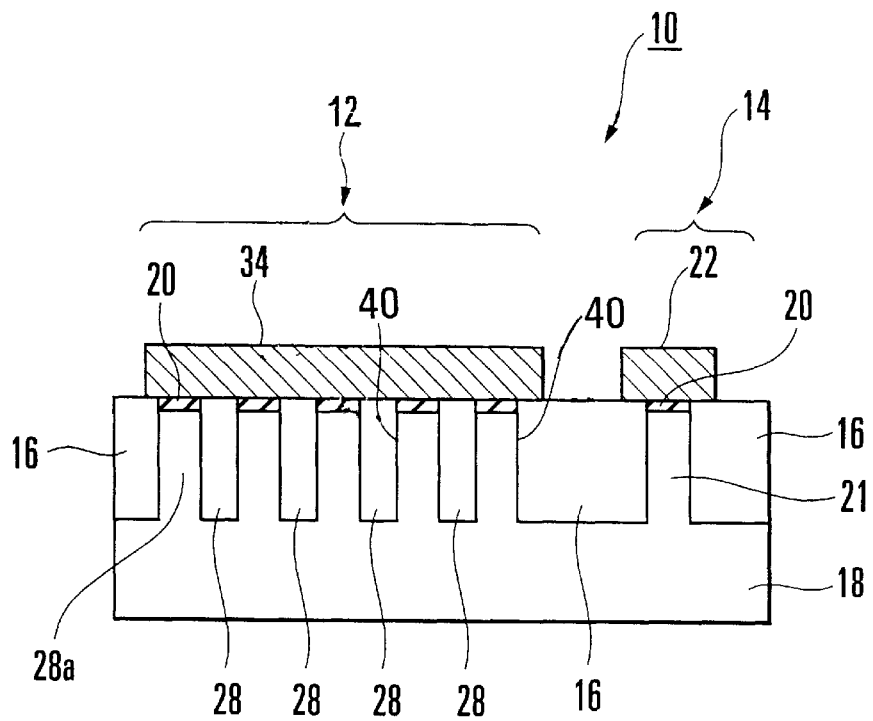
FIG. 1 is a sectional view taken along the line I—I of FIG. 2.
Figure 2:
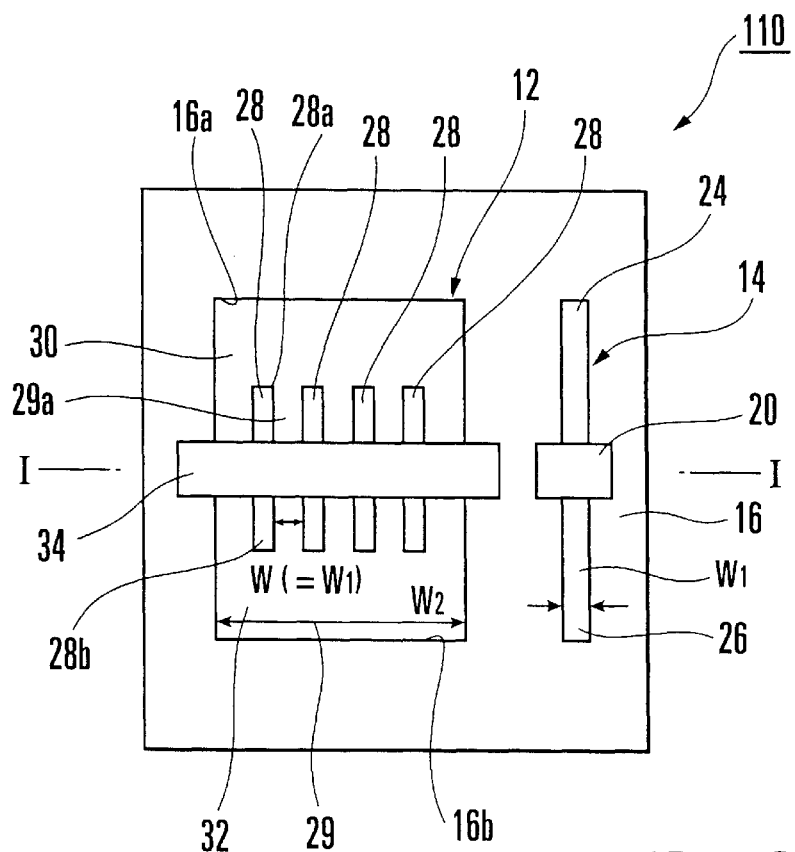
FIG. 2 is a plan view of a semiconductor device according to the first embodiment of the present invention.

FIGS. 1 and 2 show a semiconductor device according to the first embodiment of the present invention. As shown in FIG. 1, a semiconductor device 10 of this embodiment has, as the main part of the integrated circuit, one narrow-channel parallel type MISFET 12, and one narrow-channel MISFET 14 adjacent to the narrow-channel parallel type MISFET 12 and independent of it.

The narrow-channel MISFET 14 is a MISFET with a channel width W1 smallest in the integrated circuit of the semiconductor device 10, and is formed on a silicon substrate 18 within an element formation region defined by a shallow trench isolation region 16. The narrow-channel MISFET 14 has a common gate electrode 22 formed on a channel 21 in the silicon substrate 18 through a gate insulating film 20, and a source electrode 24 and drain electrode 26 formed separately on the two sides of the gate electrode 22. Source/drain regions (not shown) are respectively formed under the source electrode 24 and drain electrode 26 within the silicon substrate 18. The shallow trench isolation region 16 is formed by burying an insulator in an isolation trench 40 formed in the silicon substrate 18.

The narrow-channel parallel type MISFET 12 is formed on the same silicon substrate 18 to be adjacent to the narrow-channel MISFET 14 and is arranged at the central portion inside the element formation region defined by the shallow trench isolation region 16. The narrow-channel parallel type MISFET 12 has a plurality of shallow trench isolation bands 28 with almost the same length and formed parallel to each other at a predetermined distance. Similarly to the shallow trench isolation region 16, the shallow trench isolation bands 28 are formed by burying an insulator in 0.2-$\mu$m width, 0.3-$\mu$m deep isolation trenches formed in the silicon substrate 18. As shown in FIG. 2, the shallow trench isolation bands 28 electrically divide a wide channel 29 with a large channel width W2 into five parallel narrow channels 29a in the direction of channel width.

The distance among the shallow trench isolation bands 28 and the distance between the shallow trench isolation bands 28 and shallow trench isolation region 16, that is, a channel width W of each parallel narrow channel 29a is equal to the channel width W1 of the channel 21 of the narrow-channel MISFET 14, and is 0.2 $\mu$m. Although not clear in FIG. 1, the surface of the gate insulating film 20 is lower than those of the shallow trench isolation region 16 and shallow trench isolation bands 28 by about 10 nm.

As shown in FIG. 2, one end 28a of each shallow trench isolation band 28 is arranged away from one side 16a, extending in the direction of channel width, of the shallow trench isolation region 16 which defines the element formation region. In the region between the ends 28a of the respective shallow trench isolation bands 28 and the shallow trench isolation region 16, one common source diffusion region (not shown) is formed on the silicon substrate 18 along one side 16a of the shallow trench isolation region 16, and one common source electrode 30 is formed on the source diffusion region.

The other end 28b of each shallow trench isolation band 28 is arranged away from the other side 16b, extending in the direction of channel width, of the shallow trench isolation region 16 which defines the element formation region. In the region between the ends 28b of the respective shallow trench isolation bands 28 and the shallow trench isolation region 16, one common drain diffusion region (not shown) is formed on the silicon substrate 18 along the other side 16b of the shallow trench isolation region 16, and one common drain electrode 32 is formed on the drain diffusion region. The distance between the ends 28a of the shallow trench isolation bands 28 and one side 16a of the shallow trench isolation region 16, and that between the ends 28b of the shallow trench isolation bands 28 and one side 16b of the shallow trench isolation region 16, are of such values that allow contact between the ends 28a and side 16a, and between the ends 28b and side 16b, e.g., about 0.36 $\mu$m.

The narrow-channel parallel type MISFET 12 has an elongated gate electrode 34 extending across the centers of the respective shallow trench isolation bands 28, formed on the silicon substrate 18 through the gate insulating film 20, in the direction of channel width. Source/drain regions are formed at the two ends of the channel under the gate electrode 34.

Therefore, the narrow-channel parallel type MISFET 12 described above has an arrangement in which a wide-channel MISFET is converted into a MISFET with a channel array formed by gathering parallel channels each having a channel width W equal to the channel width W1 of the narrow-channel MISFET 14 and with common source/drain regions at the two ends of the channel array.

In this embodiment, the MISFET having the wide channel 29 with the channel width W2, which is comparatively large on the integrated circuit of the semiconductor device 10, can be substituted by the narrow-channel parallel type MISFET 12 having a channel array having an integer multiple of parallel channels each equal in channel width to that of a MISFET having the narrowest channel width W1 on the integrated circuit.

According to this embodiment, all the MISFETs constituting the integrated circuit of the semiconductor device 10 can be substantially formed by MISFETs formed to have the same channel width W1. Therefore, the narrow-channel parallel type MISFET 12 has the same function as that of the narrow-channel MISFET 14 for the channel width, and the threshold value becomes equal between the MISFET 12 with the large channel width and the MISFET 14 with the small channel width.

A method of manufacturing the semiconductor device 10 with the above arrangement will be described with reference to FIGS. 3A to 3D.

Figure 3A:
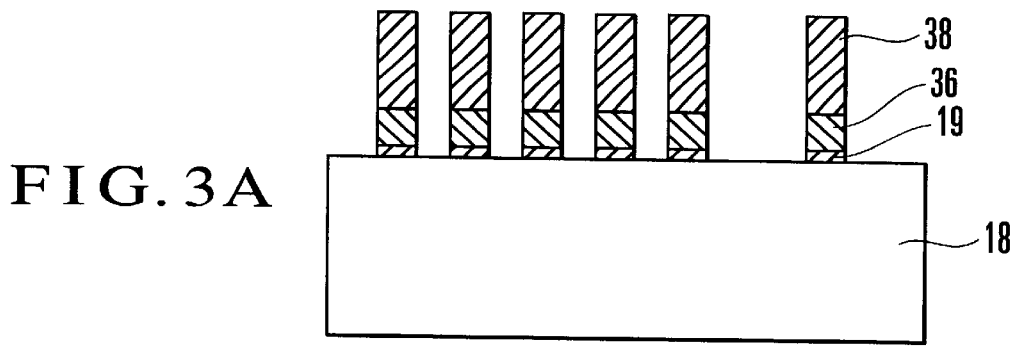
FIGS. 3A to 3D are sectional views showing the steps in manufacturing the semiconductor device shown in FIG. 1.

First, as shown in FIG. 3A, a 6-nm thick silicon oxide film 19 is formed on a silicon substrate 18, and subsequently a 160-nm thick silicon nitride film 36 is formed by CVD (Chemical Vapor Deposition). The silicon oxide film 19 serves as a protection film in subsequent ion implantation to the silicon substrate 18. The silicon nitride film 36 serves as a protection film for protecting an element formation region in a subsequent step.

Subsequently, a photoresist film is formed on the silicon nitride film 36, and is processed by photolithograpy to form an etching mask 38 with 0.2-µm opening patterns. The opening patterns correspond to the patterns of the shallow trench isolation bands 28 (FIGS. 1 and 2), and the distance between the opening patterns corresponds to the channel width. By using the etching mask 38, the silicon nitride film 36 and silicon oxide film 19 are etched to expose the silicon substrate 18 at the bottoms of the trench patterns.

In the photolithography process, preferably, photolithograpy using, e.g., a Lebenson phase shift mask, is employed. With the Lebenson phase shift mask, the resolution becomes about twice that of photolithograpy using an ordinary mask, and a thin-line parallel structure with a small isolation width of 0.2 µm can be obtained. Furthermore, when a shallow trench isolation structure with a small isolation width is employed, the area occupied by the MISFETs on the integrated circuit can be reduced.

With lithography using electron beam exposure method or the like, although the manufacturing throughput is low, a thin-line parallel structure with a small isolation width can be obtained in the same manner as in a case wherein the Lebenson phase shift mask is used.

Figure 3B:
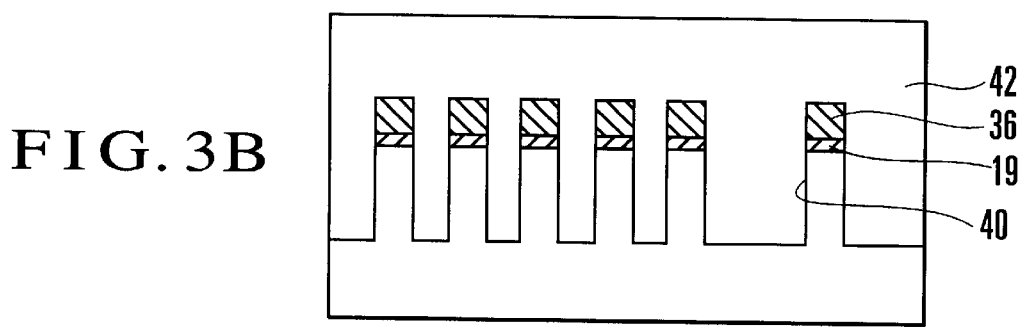

By using the etching mask 38, the silicon substrate 18 is etched by anisotropic dry etching, to form an isolation trench 40 as shown in FIG. 3B. After etching, thermal oxidation is performed to remove the damaged layer on the etched surface and to round the corner of the channel side edge portion which is etched vertically. By rounding the corner of the channel side edge portion, concentration of the gate electric field to the channel side edge portion is relaxed, thereby relaxing the hump characteristics of the gate voltage to drain current characteristics.

Figure 17:
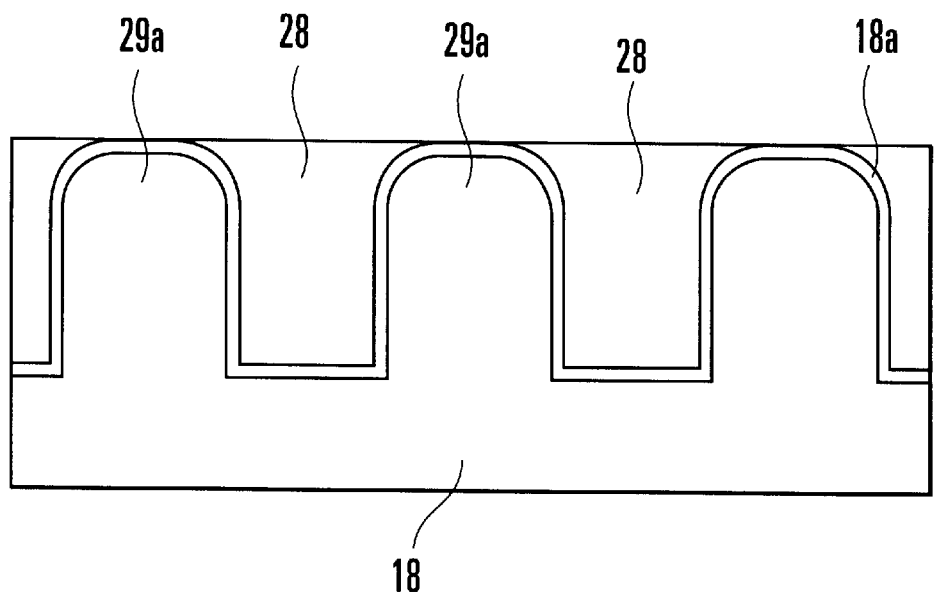
FIG. 17 is a sectional view showing the shape of the channel side edge portion of the narrow-channel parallel type MISFET.

By thermal oxidation, as shown in FIG. 17, the corners (channel side edge portions) at the two sides of the upper portion of each parallel narrow channel 29a are rounded. The radius of curvature of each rounded channel side edge portion is about 70 nm. Reference numeral 18a denotes a thermal oxide film.

In place of the method of forming a silicon oxide film 42 by CVD to fill the isolation trench 40, after the isolation trench 40 is formed in the silicon substrate 18, the surface of the isolation trench 40 may be oxidized by using only oxygen, thereby filling the isolation trench 40 with a silicon oxide film. The step of forming the narrow channel isolation band of the MISFET need not be performed separately from the step of forming the shallow trench isolation trench of the MISFET, and may be preferably performed simultaneously with isolation of the MISFET, so the number of manufacturing steps may not increase. As the material to be buried in the narrow channel isolation band, it is convenient to use the same material as that used for forming the shallow trench isolation region. In this embodiment, a silicon oxide film formed by CVD is used. A silicon nitride film formed by CVD can also be used auxiliarily.

The silicon oxide film 42 is polished by CMP (Chemical and Mechanical Polishing) or etched back to expose the silicon nitride film 36. Subsequently, the silicon oxide film 42 and silicon nitride film 36 are polished or etched back until the thickness of the silicon nitride film 36 becomes about 10 nm, thereby planarizing the substrate surface.

Figure 3C:
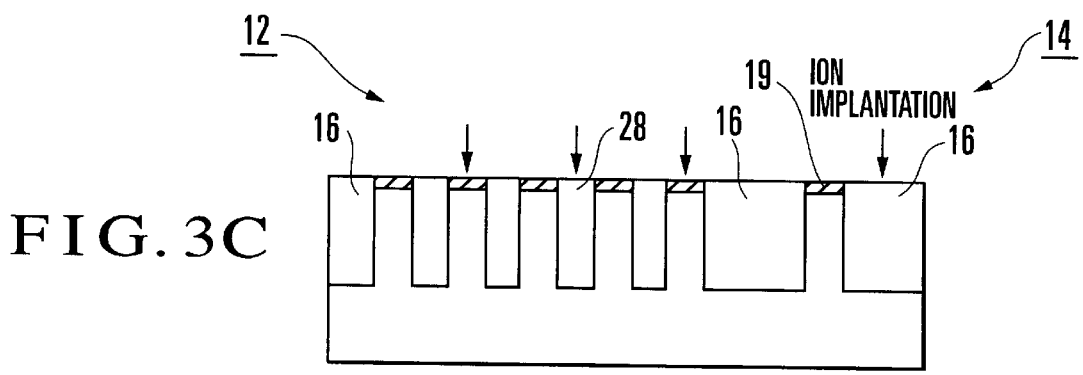

As shown in FIG. 3C, the silicon nitride film 36 is removed to expose the silicon oxide film 19, and shallow trench isolation regions 16 and shallow trench isolation bands 28 are formed. Hence, the surfaces of the shallow trench isolation regions 16 and shallow trench isolation bands 28 become higher than those of the respective channels of the narrow-channel parallel type MISFET 12 and narrow-channel MISFET 14 by 10 nm. Then, an impurity for adjusting the threshold voltage is ion-implanted to the channel portions of the MISFETs 12 and 14. After ion implantation, the silicon oxide film 19 is removed by etching, and a gate insulating film 20 is formed.

When the gate insulating film is formed in accordance with the above manufacturing method, a further improvement in the quality of the gate insulating film 20 of the MISFET can be expected.

Referring to FIG. 3A, when the 6-nm thick silicon oxide film 19 is to be formed, it is formed as an ordinary thermal oxide film. After the element isolation trench 40 is formed, this thermal oxide film is removed once. A thermal oxide film is then formed again, and an impurity for adjusting the threshold voltage is introduced by ion implantation to the channel portion through this thermal oxide film. After that, the thermal oxide film is removed, and a gate insulating film 20 is formed for the third time.

When the gate insulating film 20 is to be formed, a silicon oxide film or silicon oxynitride film is preferably used as the gate insulating film 20. According to the first reason, the substrate material is silicon, and by oxidizing or oxynitriding the silicon substrate, a stable, high-quality gate insulating film can be obtained.

According to the second reason, the process for rounding the channel side edge portion is performed by oxidation, as described above. Considering the continuity of the material with the gate insulating film 20, the material mentioned above is preferable. A gate insulating film 20 with a multilayered structure using such a material to form the lowest layer can also be employed. The nitrogen concentration of the silicon oxynitride film is arbitrary.

Figure 3D:
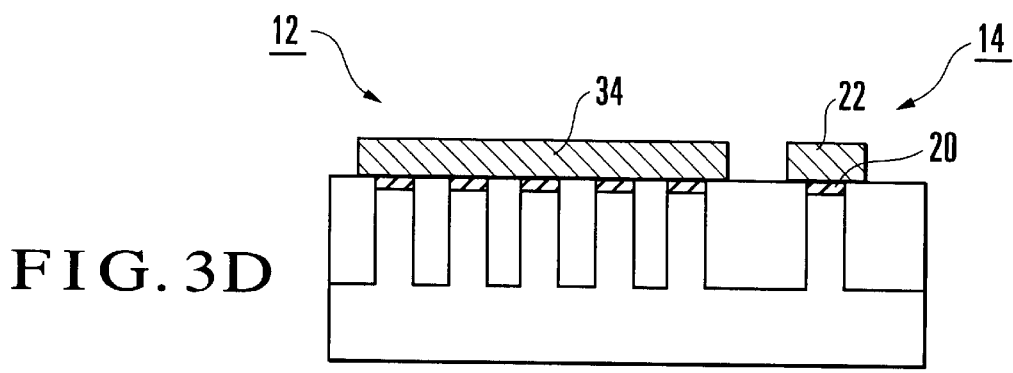

As shown in FIG. 3D, gate electrodes 22 and 34 are formed on the silicon substrate 18 in prospective formation regions of MISFETs 12 and 14, respectively, to cross a direction perpendicular to the channel. Thus, the manufacture of the semiconductor device 10 of this embodiment is completed.

As the material of the gate electrodes 22 and 34, the following materials are appropriate:
1) polysilicon
2) amorphous silicon
3) silicon-germanium alloy
4) a silicide material such as WSi, $TiSi_x$, $CoSi_x$, or $NiSi_x$
5) a metal such as Al, W, Ta, or TiN
6) a multilayered structure having a combination of a lower layer made of a material of either one of 1) to 3) and an upper layer made of the material of 4) or 5)

In order to evaluate the semiconductor device 10 described above, a semiconductor device sample with the same arrangement as that of the semiconductor device 10 but having a narrow-channel parallel type MISFET 12 with various different channel widths was fabricated in accordance with the above fabricating method. The relationship between the channel width and threshold voltage of the narrow-channel parallel type MISFET 12 of this semiconductor device sample was studied.

Figure 4:
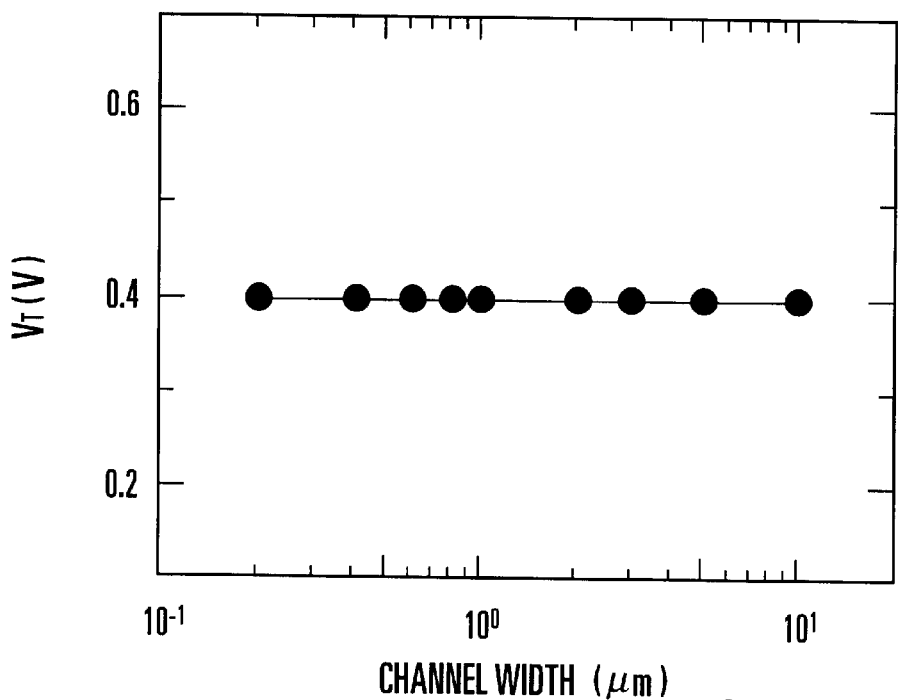
FIG. 4 is a graph showing the relationship between the channel width and threshold voltage of the narrow-channel parallel type MISFET shown in FIG. 1.
Figure 9:
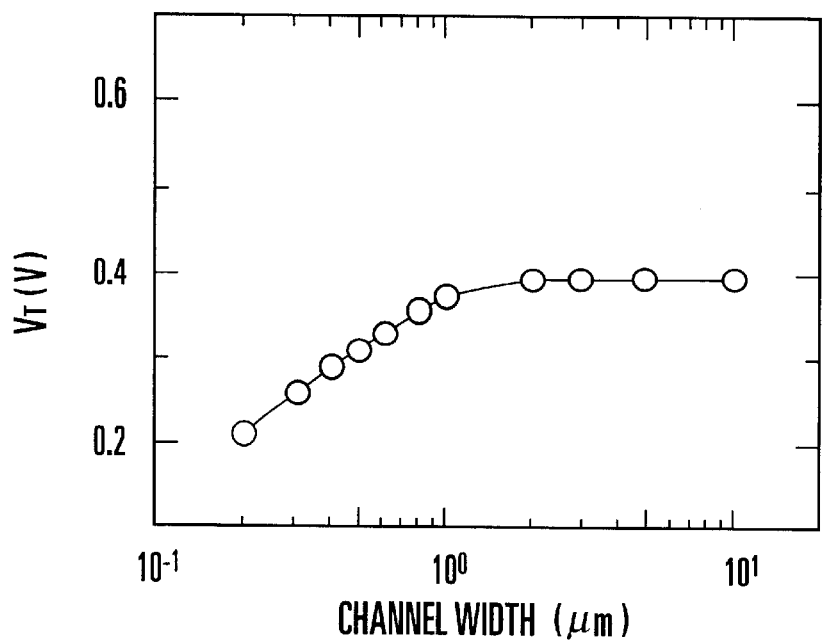
FIG. 9 is a graph showing the relationship between the channel width and threshold voltage of the conventional MISFET.

As a result, as shown in FIG. 4, the threshold voltage of the narrow-channel parallel type MISFET 12 having narrow channels each with a width of 0.2 μm was constantly 0.4 V regardless of the size of the channel width of the MISFET. In contrast to this, in the conventional MISFET, as shown in FIG. 9, when the channel width is 0.2 μm, the threshold voltage is about 0.2 V. Therefore, in a narrow-channel parallel type MISFET constituted by narrow channels each having this threshold voltage, even when the channel width of the MISFET is increased to 10 μm, the threshold voltage does not become 0.4 V.

Figure 18:
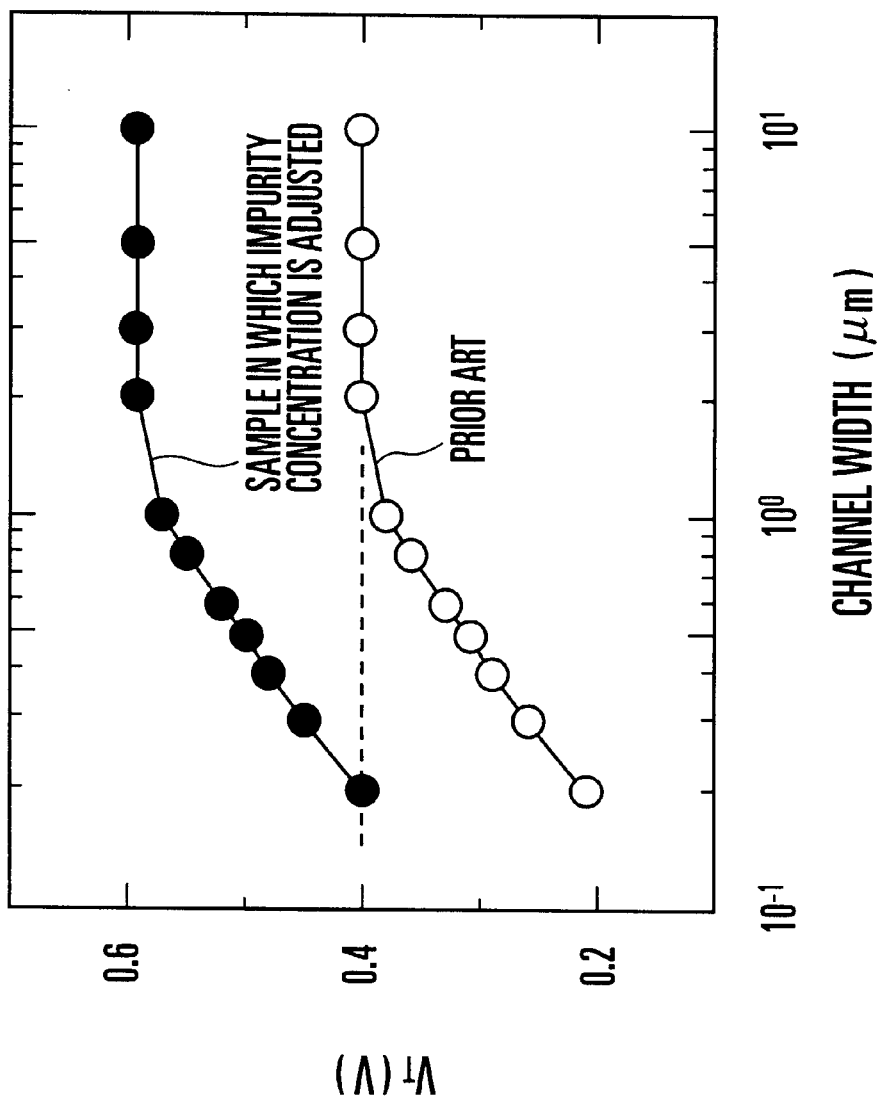
FIG. 18 is a graph showing the relationship between the threshold voltage and channel width of a wide-channel MISFET before and after adjustment of the impurity concentration of the channel.

However, when the channel impurity concentration is increased, the threshold voltage of the MISFET with a channel width of 0.2 μm, the channel impurity concentration of which is increased, can be set equal to that of the conventional MISFET with a channel width of 10 μm. FIG. 18 shows the characteristics of an example in which the channel impurity concentration is increased to compare with the characteristics of the conventional case (FIG. 9).

It is apparent from FIG. 18 that, when the impurity concentration is adjusted in comparison with the conventional MISFET, even in a narrow-channel parallel type MISFET with a channel width of 10 μm in which each channel has a width of 0.2 μm, the threshold voltage becomes 0.4 V. Hence, the threshold voltage does not depend on the channel width unlike in FIG. 4, that is, the threshold voltage characteristics that do not depend on the channel width can be obtained. Regarding adjustment of the channel impurity concentration, it suffices if the threshold voltage of the narrow channel serving as the unit channel matches the threshold of the conventional wide-channel MISFET.

Figure 5:
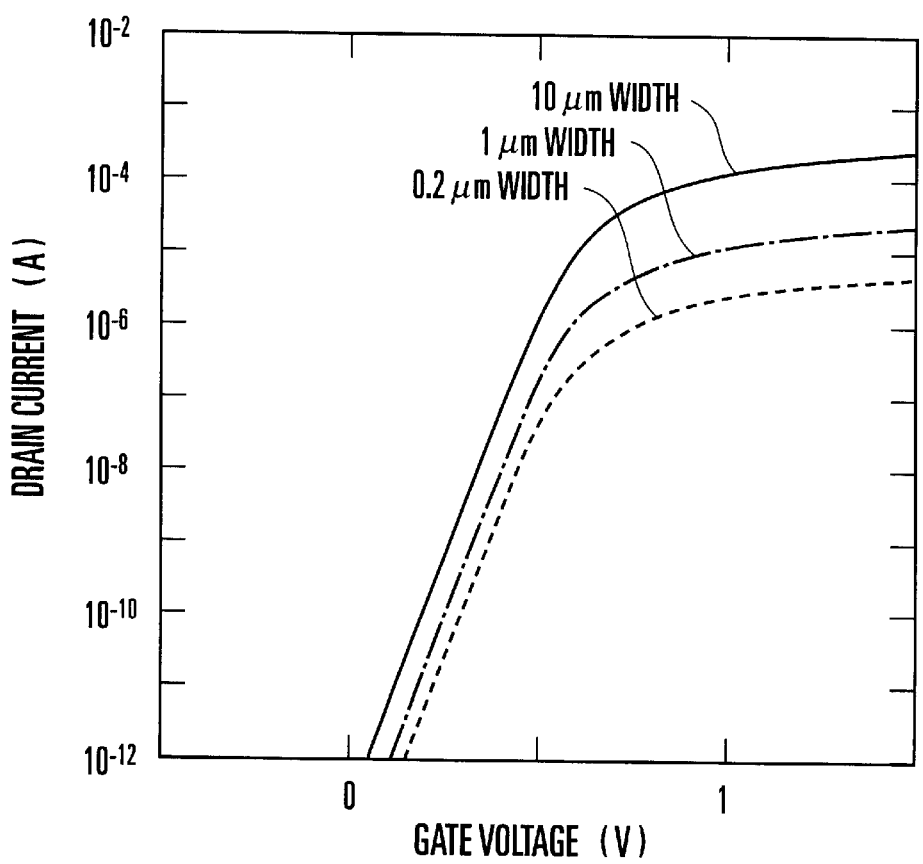
FIG. 5 is a graph showing the relationship between the gate voltage and drain current of the narrow-channel parallel type MISFET shown in FIG. 1.
Figure 10:
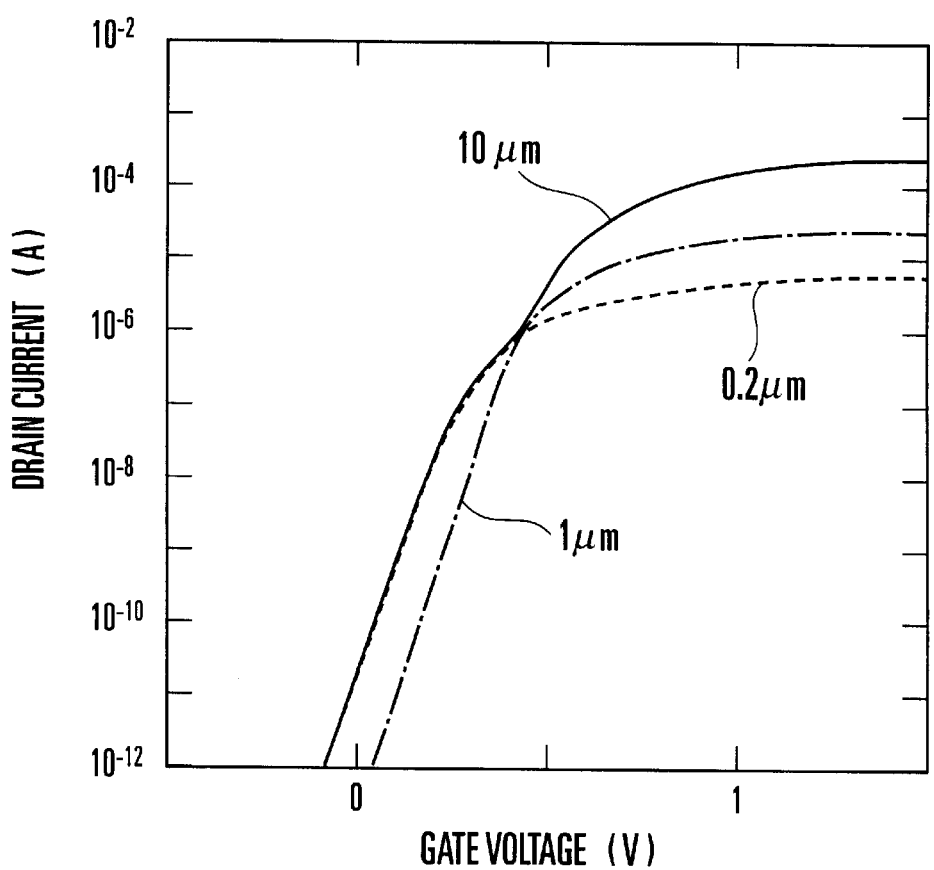
FIG. 10 a graph showing the relationship between the gate voltage and drain current of the conventional MISFET.
Figure 11A:
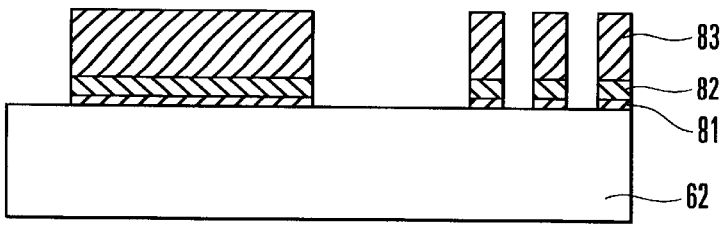
FIGS. 11A to 11E are sectional views showing the steps in manufacturing the conventional MISFET.
Figure 11B:
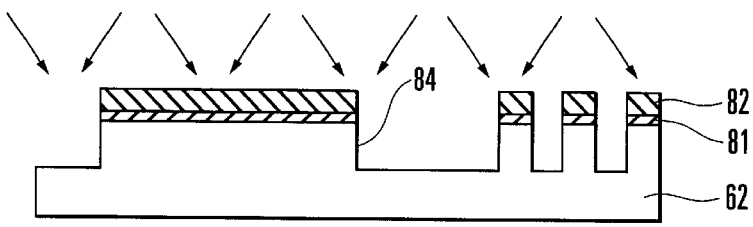
Figure 11C:
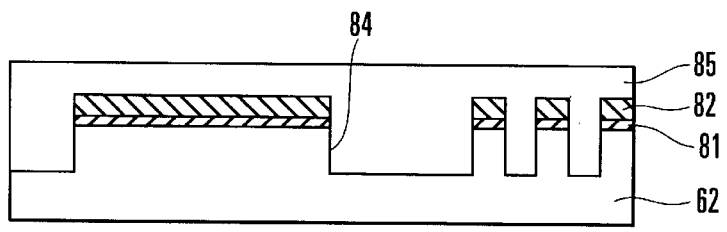
Figure 11D:
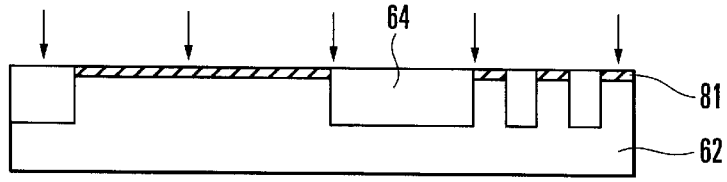
Figure 11E:
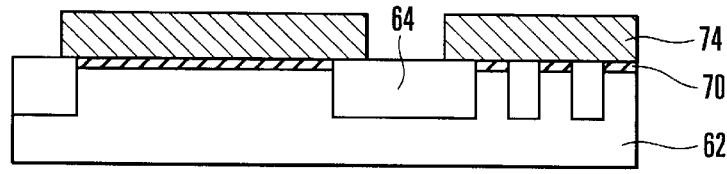

A semiconductor device sample with the same arrangement and the same channel width as those of the semiconductor device 10 of this embodiment was fabricated, and its gate voltage to drain current characteristics were examined. The result shown in FIG. 5 was obtained. More specifically, unlike the conventional characteristics shown in FIG. 10, the gate voltage to drain current characteristics of the narrow-channel parallel type MISFET 12 of the semiconductor device 10 of this embodiment became linear without any step, even if the channel widths are 10 μm and 1 μm.

Second Embodiment

Figure 6:
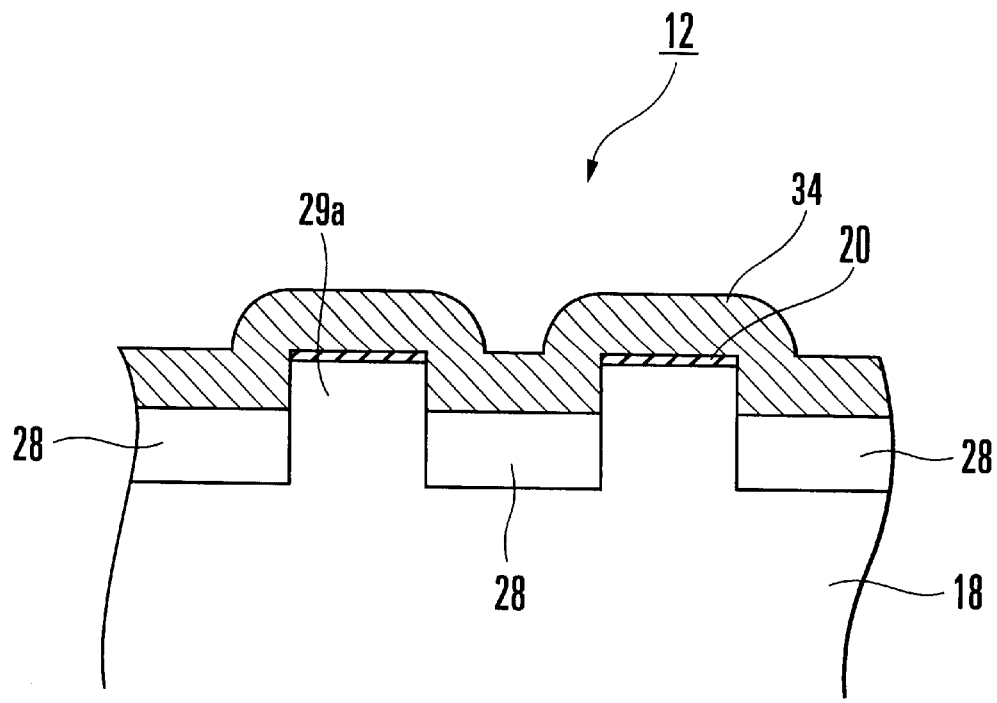
FIG. 6 is a sectional view of the main part of a semiconductor device according to the second embodiment of the present invention.
Figure 7:
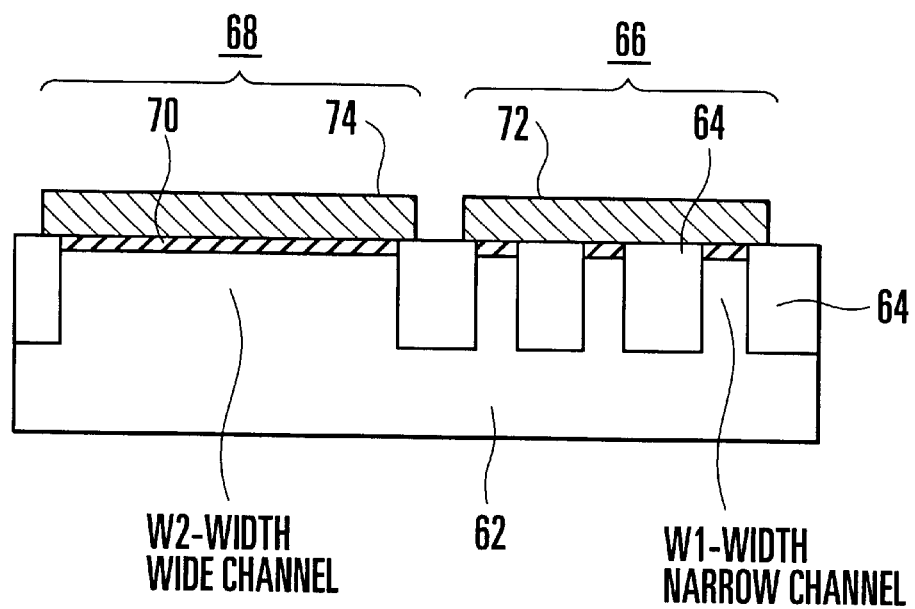
FIG. 7 is a sectional view taken along the line II—II of FIG. 8.
Figure 8:
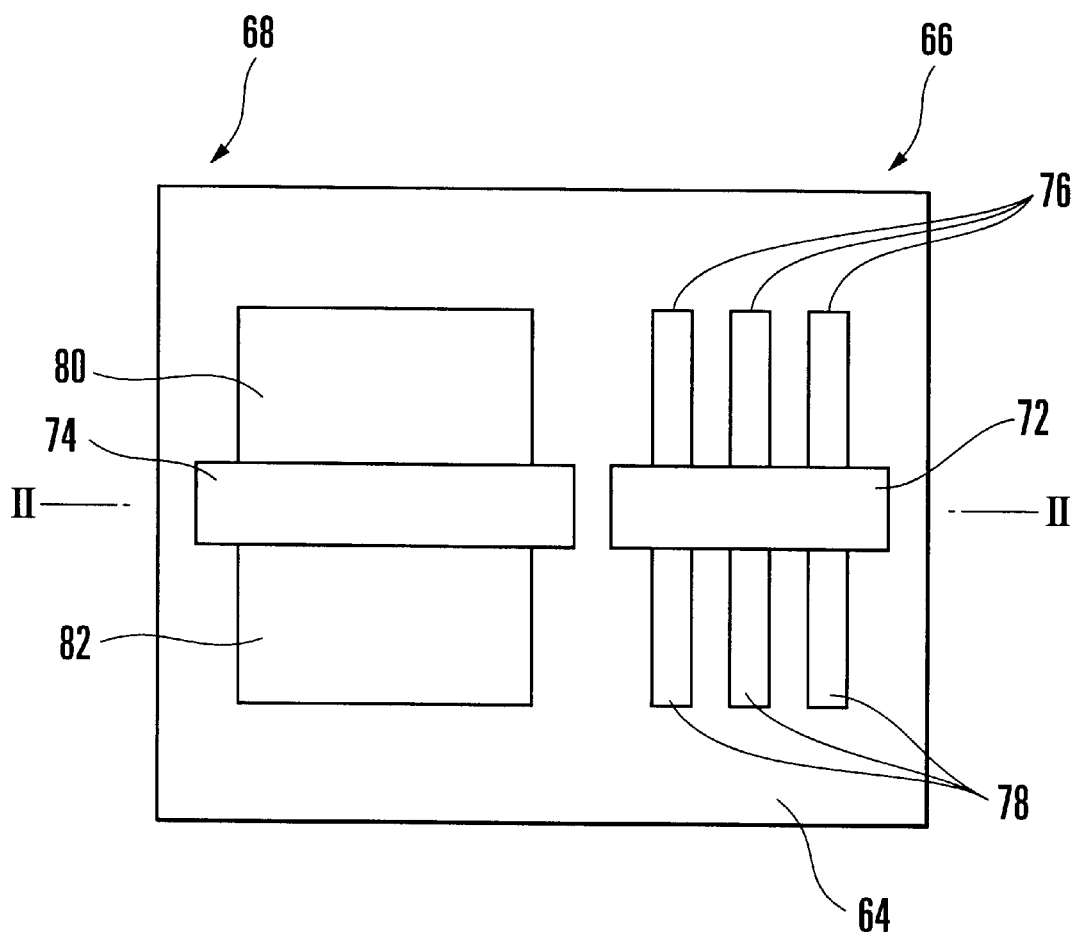
FIG. 8 is a plan view of a conventional semiconductor device with MISFETs.

FIG. 6 shows the main part of a semiconductor device according to the second embodiment of the present invention. FIG. 6 shows the periphery of a gate electrode 34 of a narrow-channel parallel type MISFET 12. The semiconductor device of this embodiment has the same arrangement as that of the semiconductor device 10 shown in FIGS. 1 and 2, except that the surface of the element formation region of a narrow-channel MISFET 12 (and that of a narrow-channel MISFET 14), i.e., the upper surface of a gate insulating film 20, is located at a position higher than the upper surfaces of shallow trench isolation bands 28 (and that of a shallow trench isolation region 16).

In the manufacture of the semiconductor device described above, when a silicon oxide film 42 identical to that in the step of FIG. 3C is to be polished or etched back, a silicon nitride film 36 is etched simultaneously until a silicon oxide film 19 is exposed, so that the upper surface of the silicon oxide film 19 becomes flush with the upper surfaces of the shallow trench isolation region 16 and shallow trench isolation bands 28. After ion implantation, when the silicon oxide film 19 is to be removed, the buried material of the shallow trench isolation bands 28 (and the shallow trench isolation region 16) is etched simultaneously, so that the surfaces of the shallow trench isolation bands 28 (and shallow trench isolation region 16) become lower than that of channels 29a. In this state, the gate insulating film 20 is formed on the channels 29a, and the gate electrode 34 is formed successively, thereby fabricating the semiconductor device with the narrow-channel parallel type MISFET 12 (and narrow-channel MISFET 14) shown in FIG. 6.

In this embodiment, the upper surfaces of the shallow trench isolation bands 28 and shallow trench isolation region 16, with which the parallel narrow channels 29a of the narrow-channel parallel type MISFET 12 and a channel 21 of the narrow-channel MISFET 14 come into contact, are recessed from the parallel narrow channels 29a and channel 21, so the gate electrode 34 is formed to surround the channels.

This semiconductor device was evaluated in the same manner as in the first embodiment. It was confirmed that, in the semiconductor device of this embodiment, the threshold voltage did not vary depending on the channel width, in the same manner as in the first embodiment, and that linear gate voltage to drain current characteristics were exhibited.

The operation of the narrow-channel parallel type MISFET of the present invention described above will be theoretically described. Reference numerals employed in the accompanying drawings are different from those employed in the first and second embodiments.

First, the necessary small channel width of the narrow-channel parallel type MISFET will be described with referring to FIG. 12. In a wide-channel MISFET with a shallow trench isolation region, the channel side edge portion MISFET with a low threshold voltage and a channel planar portion MISFET with a high threshold voltage are connected parallel to each other, as described above. In this state, a MISFET with a gate length of 0.4 μm has a saturation drain current that depends on the channel width, as shown in FIG. 12.

What is characteristic in this case is that, with the channel width of 0.6 μm or less, the channel width dependence of the saturation drain current exhibits a curve much more moderate than that with the channel width of 0.6 μm or more. This phenomenon can be explained by the relationship between the depletion region of the channel side edge portion and the size of the channel width.

Figure 13A:
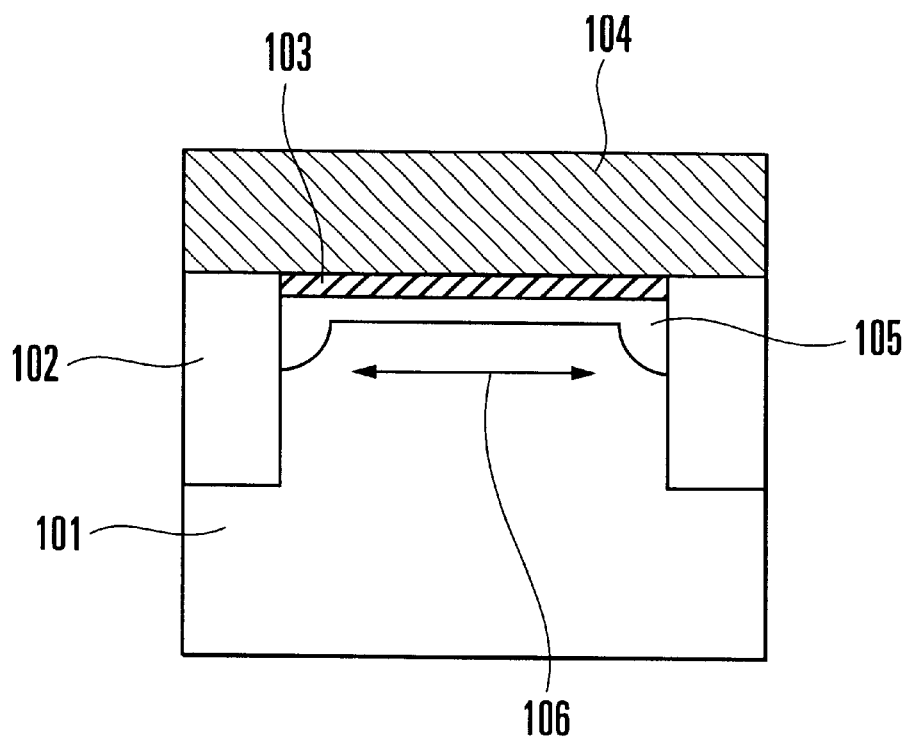
FIGS. 13A and 13B are schematic sectional views of a wide MISFET and narrow MISFET, respectively, for explaining the relationship between the depletion layer of a channel side edge portion and the depletion layer of a channel planar portion.

Depletion layers 105 formed in the channel side edge portion and the channel planar portion will be described with reference to FIGS. 13A and 13B. As a gate voltage is applied to the MISFET, in the wide-channel MISFET, the depletion layer 105 is formed in the channel side edge portion with a low gate voltage, as shown in FIG. 13A, and a drain current starts to flow through this portion. After that, when a drain current starts to flow through a channel planar portion 106 which is sufficiently wider than the region width of the depletion layer 105 of the channel side edge portion, the current amount is much larger than that in the channel side edge portion, and accordingly a saturation drain current proportional to the channel width is observed. Reference numeral 101 denotes a silicon substrate; 102, a shallow trench isolation region; 103, a gate insulating film; and 104, a gate electrode.

Figure 13B:
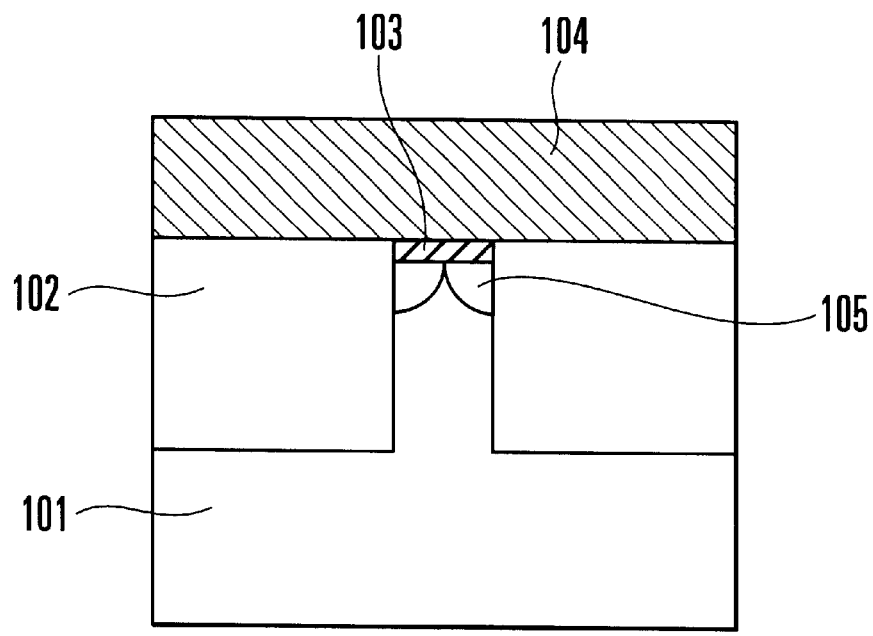
Figure 14:
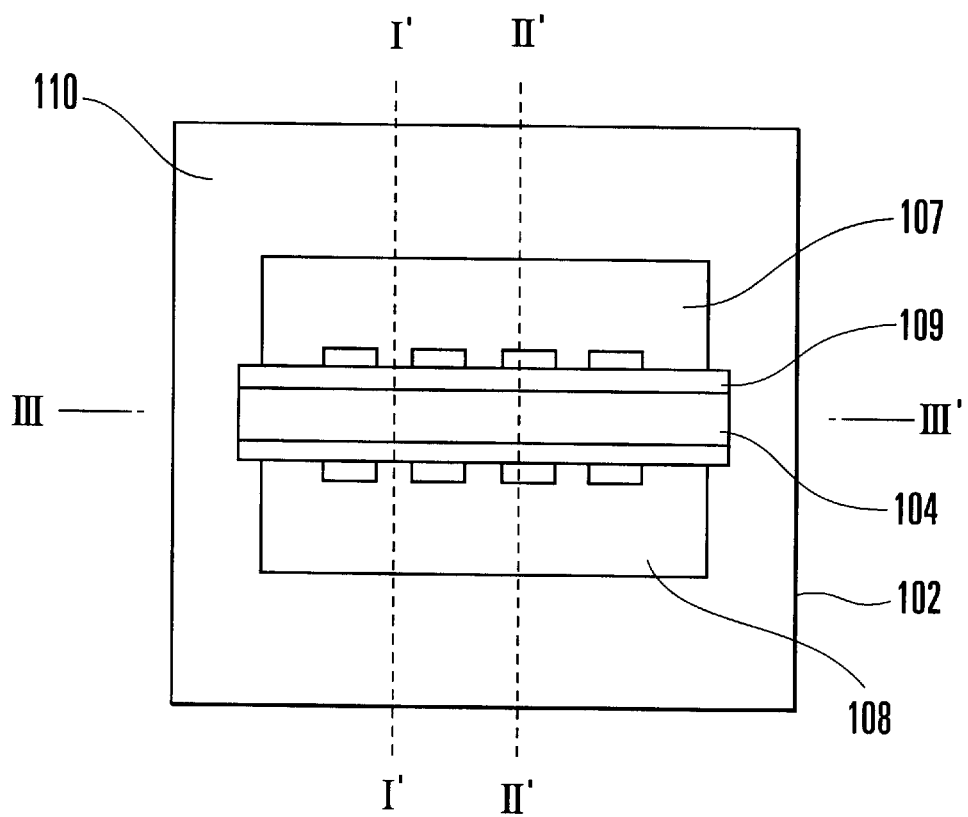
FIG. 14 is a plan view of a narrow-channel parallel type MISFET during formation of its gate side walls.

Meanwhile, in the narrow-channel MISFET, as shown in FIG. 13B, upon application of a low gate voltage, the depletion layer 105 extending from the channel side edge portion reaches the channel planar portion and is already connected to it. This means that a channel substantially not depending on the channel width is formed, and a saturation drain current which does not easily depend on the channel width flows. Therefore, the proportional relationship between the saturation drain current and the channel width becomes smaller than that in the wide-channel region. It can be evaluated that this structure has a channel width region with a small fluctuation in characteristics, and the dimensional allowance in the manufacture can increase.

The necessary small channel width must be such a value that the hump characteristics described above do not appear with it. Considering the fact that a region with a drain current which is moderately proportional to the channel width is a channel width region with a small fluctuation in characteristics, a channel width region of 0.6 μm or less is preferable, as shown in FIG. 12, to serve as the channel width unit in the narrow-channel parallel type MISFET.

In view of these points, in place of a wide-channel MISFET, the semiconductor device according to the present invention has a narrow-channel parallel type MISFET having a plurality of parallel narrow channels each with a channel width of 0.6 μm or less and a common source electrode and common drain electrode. The threshold voltage of the narrow-channel parallel type MISFET is the same as the threshold voltage of the individual channel, so the hump characteristics do not appear. When the number of channels of the narrow-channel parallel type MISFET, i.e., the channel width, is adjusted, a drain current equal to that in the conventional channel type MISFET can be obtained.

Figure 15A:
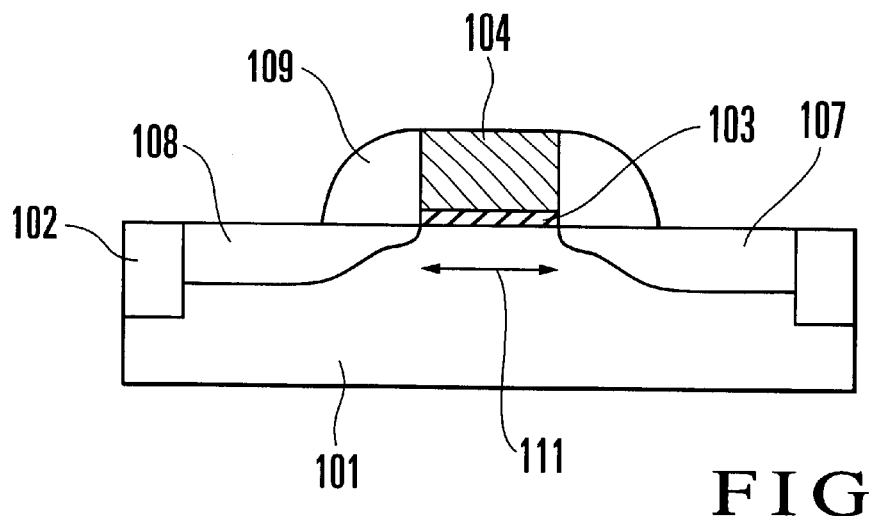
FIG. 15A is a sectional view taken along the line I'—I' of the channel portion of FIG. 14, and FIGS. 15B and 15C are sectional views taken along the line II'—II' of the channel portion of FIG. 14.
Figure 15B:
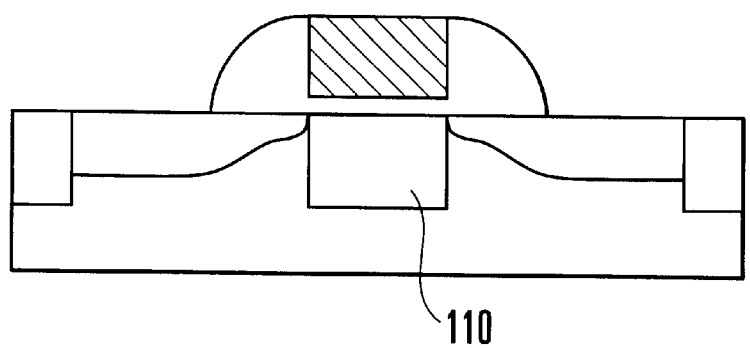

The necessary length of a shallow trench isolation band 110 in the source-drain direction will be described with reference to FIG. 14 and FIGS. 15A to 15C. The necessary minimum length of the shallow trench isolation band 110 in the source-drain direction must be at least equal to a channel length 111, as shown in FIG. 15A, so that the unit channel width becomes the same. Accordingly, as shown in FIG. 15B, the shallow trench isolation band 110 requires the same length as the channel length 111 immediately under the gate electrode.

Figure 15C:
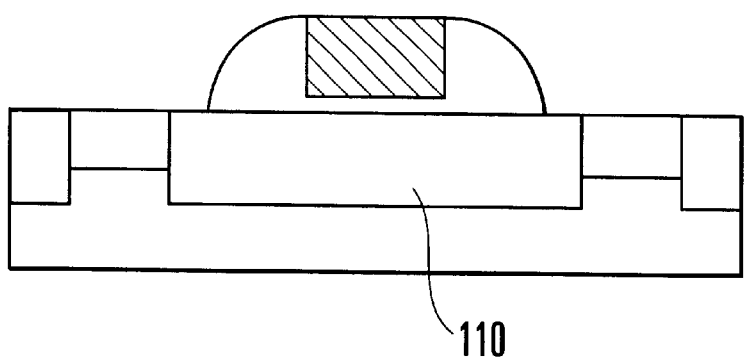

The maximum length of the shallow trench isolation band 110 in the source-drain direction will be described with reference to FIG. 15C. Basically, there is no limitation on the maximum length of the shallow trench isolation band 110 in the source-drain direction. When, however, the distance between the position of a contact hole, through which the MISFET and an interconnection are connected to each other, and the gate side wall end increases, parasitic resistances increase in a source electrode 107 and drain electrode 108, and accordingly the performance of the MISFET degrades. In order to avoid this degradation in performance, the contact hole must be set close to a gate side wall 109. Therefore, the maximum allowable length of the shallow trench isolation band 110 in the source-drain direction suffices if it is equal to the end-to-end length of the gate side wall 109.

The sectional size of the shallow trench isolation band 110 will be described. As described above, one of the problems of the present invention that must be solved is that the MISFET characteristics should not vary. Accordingly, the leakage current flowing through the shallow trench isolation band 110 other than the channel portion of the MISFET must be suppressed. In other words, the current must be controlled only by the channel portion.

Figure 16:
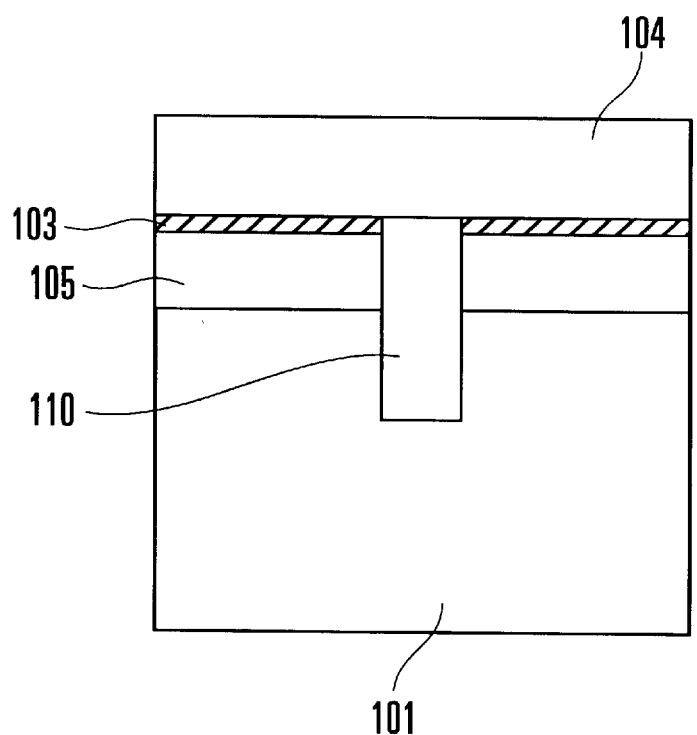
FIG. 16 is a schematic sectional view showing the relationship between the depth of the shallow trench and the depth of the depletion layer of a shallow trench isolation band.

The necessary isolation depth of the shallow trench isolation band 110 will be described with reference to FIG. 16. FIG. 16 shows a state wherein a gate voltage is applied and a depletion layer 105 is formed in the element region. In FIG. 16, the depth of the shallow trench isolation band 110 is sufficiently larger than the thickness of the depletion layer 105, and adjacent narrow channels are electrically isolated from each other. Therefore, no leakage current is generated to flow over the shallow trench isolation band 110.

If the depth of the shallow trench isolation band 110 is almost equal to the thickness of the depletion layer 105, adjacent depletion layers 105 are connected to each other to surround the shallow trench isolation band 110. Then, inversion layer charges appear, although a few, to form a leakage current flowing through the shallow trench isolation band 110. When an inversion layer is adversely formed near the shallow trench isolation band 110, a parasitic MISFET is formed, and the drain current cannot be controlled by only the channel portion. Hence, the depth of the shallow trench isolation band 110 must be sufficiently larger than the thickness of the depletion layer 105.

The necessary isolation width of the shallow trench isolation band 110 will be described. First, the potential difference between narrow channels adjacent to each other at points that are at the equal distance from the drain electrode 108 or source electrode 107 will be examined. The potential difference is normally substantially 0 V, and accordingly it suffices if the isolation width is of such a degree that no tunnel current directly flows between the narrow channels through the insulator of the shallow trench isolation band 110. Such a width is about 10 nm.

In practice, in order to obtain electrical insulation even when the shallow trench isolation band 110 is sufficiently deeper than the depletion layer 105, the insulator which is to fill a shallow trench isolation trench to form the shallow trench isolation band 110 must be buried without a gap. Accordingly, the width of the shallow trench isolation band 110 is determined by the relationship between the depth and width, with which the insulator can be buried in the shallow trench isolation trench, that is, by the aspect ratio.

In the conventional manufacturing method, it is very difficult to bury a shallow trench isolating insulator in a shallow trench isolation trench with a relationship between the depth and width that is, an aspect ratio of 2 or more, without any gap. Accordingly, a width with a sufficiently large withstand voltage while having an aspect ratio of 2 or less is necessary. In the embodiment described above, in order to satisfy these two conditions, the isolation width of the shallow trench isolation band is set to 0.2 μm, and the shallow trench depth thereof is set to 0.3 μm.

As has been described above, according to the present invention, a wide channel with a large channel width is defined into channels with desired channel widths by shallow trench isolation bands, so that a MISFET not causing hump characteristics while exhibiting good switching characteristics is realized. Also, a semiconductor device is realized in which one wide-channel MISFET is substantially converted into an array of parallel type MISFETs each with a desired channel width, for example, into a narrow-channel parallel type MISFET with the same channel width as that of a narrow-channel MISFET formed on the same substrate.

In other words, a semiconductor device can be realized which has a wide-channel MISFET exhibiting the same threshold voltage as that of a narrow-channel MISFET mixedly formed on the same substrate and linear gate voltage to drain current characteristics. That is, even in a semiconductor device where MISFETs with various different channel widths are mixedly formed, the threshold voltages of the MISFETs can be set uniform.

Also, an integrated circuit in which a wide-channel MISFET and narrow-channel MISFET with the same threshold voltage are arranged on the same substrate can be realized without adding steps such as ion implantation.

What is claimed is:

1. A semiconductor device comprising:
   a plurality of shallow trench isolation bands formed in a band-like shape within an element formation region defined by a shallow trench isolation region;

a plurality of channels isolated from each other by said shallow trench isolation bands and extending parallel to each other;

a common source region or a common source electrode formed at one end of each of said channels;

a common drain region or a common drain electrode formed at the other end of each of said channels;

a common gate electrode formed on said channels across said shallow trench isolation bands;

a first MISFET (Metal Insulator Semiconductor Field Effect Transistor) with said shallow trench isolation bands, channels, a common source region or a common source electrode, a common drain region or a common drain electrode, and a common gate region or a common gate electrode; and a second MISFET with a different number of channels than said first MISFET, wherein said channels of said first and second MISFETs have the same channel width.

2. A device according to claim 1, wherein each of said shallow trench isolation bands in a source-drain direction has a length equal to a channel length immediately under said gate electrode.

3. A device according to claim 1, wherein each of said shallow trench isolation bands has a shallow trench depth larger than a depth of a depletion layer formed near said shallow trench isolation bands in said channels.

4. A device according to claim 1, wherein said channels of said first and second MISFETs have a width of not more than 0.6 $\mu$m.

5. A device according to claim 1, wherein said shallow trench isolation bands have upper surfaces higher than upper surfaces of said channels.

6. A device according to claim 1, wherein said channels have upper surfaces higher than upper surfaces of said shallow trench isolation bands.

7. A semiconductor device comprising:

a plurality of shallow trench isolation bands formed in a band-like shape within an element formation region defined by a shallow trench isolation region;

a plurality of channels isolated from each other by said shallow trench isolation bands and extending parallel to each other;

a common source region or a common source electrode formed at one end of each of said channels;

a common drain region or a common drain electrode formed at the other end of each of said channels; and a common gate electrode formed on said channels across said shallow trench isolation bands;

wherein each of said shallow trench isolation bands has a shallow trench depth larger than a depth of a depletion layer formed near said shallow trench isolation bands in said channels.

8. A device according to claim 7, wherein each of said shallow trench isolation bands in a source-drain direction has a length equal to a channel length immediately under said gate electrode.

9. A device according to claim 7, wherein said channels have the same channel width of not more than 0.6 $\mu$m.

10. A device according to claim 7, further comprising at least two MISFETs (Metal Insulator Semiconductor Field Effect Transistors) with different number of channels.

11. A device according to claim 7, wherein said shallow trench isolation bands have upper surfaces higher than upper surfaces of said channels.

12. A device according to claim 7, wherein said channels have upper surfaces higher than upper surfaces of said shallow trench isolation bands.

13. A semiconductor device comprising:

a plurality of shallow trench isolation bands formed in a band-like shape within an element formation region defined by a shallow trench isolation region;

a plurality of channels isolated from each other by said shallow trench isolation bands and extending parallel to each other;

a common source region or a common source electrode formed at one end of each of said channels;

a common drain region or a common drain electrode formed at the other end of each of said channels;

a common gate electrode formed on said channels across said shallow trench isolation bands; and a silicon-base FET (Field Effect Transistor) with said shallow trench isolation bands, said plurality of channels, said common source region or said common source electrode, said common drain region or said common drain electrode, and said common gate electrode;

wherein each channel of said plurality of channels has the same channel width; and wherein said channel width is such that a reverse narrow channel effect occur.

14. A device according to claim 13, wherein each channel of said plurality of channels has the same channel width of not more than 0.6 $\mu$m.

15. A semiconductor device comprising:

a plurality of shallow trench isolation bands formed in a band-like shape within an element formation region defined by a shallow trench isolation region;

a plurality of channels isolated from each other by said shallow trench isolation bands and extending parallel to each other;

a common source region or a common source electrode formed at one end of each of said channels;

a common drain region or a common drain electrode formed at the other end of each of said channels;

a common gate electrode formed on said channels across said shallow trench isolation bands;

a first MISFET (Metal Insulator Semiconductor Field Effect Transistor) with said shallow trench isolation bands, channels, a common source region or a common source electrode, a common drain region or a common drain electrode, and a common gate region or a common gate electrode; and a second MISFET with one channel, wherein said channels of said first and second MISFETs have the same channel width of not more than 0.6 $\mu$m.

16. A device according to claim 15, wherein each of said shallow trench isolation bands in a source-drain direction has a length equal to a channel length immediately under said gate electrode.

17. A device according to claim 15, wherein each of said shallow trench isolation bands has a shallow trench depth larger than a depth of a depletion layer formed near said shallow trench isolation bands in said channels.

18. A device according to claim 15, wherein said shallow trench isolation bands have upper surfaces higher than upper surfaces of said channels.

19. A device according to claim 15, wherein said channels have upper surfaces higher than upper surfaces of said shallow trench isolation bands.

* * * * *